United States Patent
Dobyns et al.

[11] Patent Number: 5,995,117
[45] Date of Patent: Nov. 30, 1999

[54] RASTERIZATION CONTROL METHOD

[75] Inventors: Kenneth P. Dobyns, Beaverton; Robert A. Nishida, Hillsboro; George S. Walker, Beaverton, all of Oreg.

[73] Assignee: Tektronix, Inc., Wilsonville, Oreg.

[21] Appl. No.: 09/026,186

[22] Filed: Feb. 19, 1998

[51] Int. Cl.⁶ ................................................ G06F 15/00
[52] U.S. Cl. ............................................................ 345/441
[58] Field of Search .................................. 345/440, 441, 345/442, 443, 117, 118, 121

[56] References Cited

U.S. PATENT DOCUMENTS 5,602,564  2/1997  Iwamura et al. ............... 345/419
5,838,973  11/1998 Carpenter et al. ............. 395/701

Primary Examiner—Phu K. Nguyen
Attorney, Agent, or Firm—Thomas F. Lenihan

[57] ABSTRACT

One or more recently acquired waveform data sets are maintained in memory after they are initially rasterized. During repeated waveform acquisitions, when the trigger and new waveform acquisition rates become so low that rasterizer time is being wasted, one or more of the most recent previously acquired waveforms are re-rasterized and displayed again to maintain the display until another newly acquired waveform becomes available. The rasterizer's readiness to re-rasterize a previously rasterized waveform data set can be qualified with a pre-determined or programmable time delay, thereby providing more flexibility for external circuitry and controllers to optimize utilization of the rasterizer's behavior. The method of this invention works especially well with rasterizers that produce some form of randomization in their outputs.

9 Claims, 1 Drawing Sheet

RASTERIZATION CONTROL METHOD

FIELD OF THE INVENTION

This invention relates to the rasterization of acquired data-address pairs so as to prepare the data they contain for the raster scan display of a digital oscilloscope, and more particularly to how such oscilloscopes operate in the presence of a low or non-existent trigger rate and the resulting shortage of waveforms for rasterization.

CROSS-REFERENCE TO RELATED APPLICATIONS

[not applicable]

STATEMENT REGARDING FEDERALLY SPONSORED RESEARCH AND DEVELOPMENT

[not applicable]

BACKGROUND OF THE INVENTION

Modern digital oscilloscopes typically acquire and digitize input data representative of the behavior over time of an electrical signal. The resulting data-address pairs are typically "rasterized" to convert them into a two-dimensional bit-map for display by a raster scan display. Raster scan displays, like those in computer monitors, utilize a two-dimensional matrix of pixels arranged in rows and columns.

Although such displays can have only a single bit of intensity information associated with each pixel location, and are therefore limited to turning the pixel's intensity "on" or "off", more expensive raster scan displays use more memory depth in association with each pixel and thereby achieve a grey-scale spectrum of intensity choices for each pixel in the display.

Grey-scale raster scan displays can also provide "variable persistence", a way for the user to control how quickly or slowly the intensity of each illuminated pixel is decreased over time if no new intensity information is directed to that pixel. As new waveforms are acquired and displayed, the intensity values stored for the individual pixels at the locations associated with these waveforms are made brighter by some increment value. All illuminated pixels are also decremented on each display cycle. Pixels that are part of the waveform display of a repetitive waveform eventually attain a maximum intensity value and are displayed brightly, while pixels that are part of an intermittent feature of the waveform appear dimmer, depending on how infrequently that intermittent part of the waveform occurs and therefor how often they receive an additional increment of intensity value.

Infinite persistence refers to the oscilloscope display's behavior when illuminated pixel's intensity is not decremented at all. When a user selects this display mode, intensity data is only added to pixel values, never subtracted. In this mode, all of the pixels affected by repetitive waveforms eventually reach their maximum intensity values and stay there until the display settings are modified.

The rate at which an oscilloscope can acquire new waveforms, and therefore a limitation on often it can rasterize new data for its display, depends on something called "the trigger rate". A trigger signal indicates to the oscilloscope that some external event has met preestablished criteria defining when another data acquisition would be appropriate. In its simplest form, a trigger can be generated every time that the signal under test crosses a particular voltage level going in a particular direction. The "raw" trigger signal, a.k.a. main event trigger (MET), becomes active every time external events meet the preestablished criteria. However, for a variety of reasons, the oscilloscope may not be ready to make another acquisition yet. Raw triggers are ignored until the oscilloscope itself is again in a state of readiness to do another acquisition. A signal indicative of this readiness is typically ANDed with the MET to produce a MAT, or main accepted trigger. This is the trigger signal that controls data acquisition, since it means that both the external event and the rest of the oscilloscope are now at a suitable time for referencing the acquisition of another data record.

When the MAT occurs, the oscilloscope performs a sequence of activities to capture, or retain, data that is representative of the behavior of the signal under test. As implied above, the trigger event may initiate data capture, or terminate it, or provide a reference point somewhere in the middle of the acquired data record. Use of a circular data acquisition memory makes the time relationship between the trigger event and the time of the actual data capture highly adjustable.

Once the data associated with a particular trigger event has been acquired, however, it is still generally necessary for the instrument to perform some additional operations before it can initiate rasterization of that data. For example, in an instrument having a fast-in, slow-out (FISO) front end, data must be moved out of that front end and into a slower speed acquisition memory before the data is ready for rasterization. The time associate with this particular activity also delays the instrument's readiness to perform another acquisition of data.

While the data acquisition interval and the waveform rasterization period may vary widely with respect to each other, it is generally desirable to try to keep them happening in parallel with each other to maximize throughput. Under some circumstances, however, the rate of the MET, or external trigger, is highly variable. This can cause a variation in signal intensity that is irritating or frustrating to the user.

When digital oscilloscopes of the prior art are using their persistence mode (I.e., are not in the infinite persistence mode), they have traditionally responded to the absence of triggers by continuing to decrease the displayed waveform's intensity level until it reaches zero and the waveform fades away. If the trigger rate decreases, but some triggers continue to occur, fewer waveforms update the display and the perceived intensity fades to a level that may be difficult use. To deal with this situation, most digital oscilloscopes have a "brightness" control that allows the user to modify the value by which the intensity values of individual pixels are decremented, thereby increasing the persistence of each waveform and brightening the display. But, this too can be irritating or frustrating to the user if the trigger rate continues to vary.

If the trigger rate should increase again, after the brightness control has been adjusted to compensate for the reduced trigger rate, the waveform display will tend to go to maximum intensity in every illuminated pixel, thereby "saturating" the display. Thus, in the presence of a variable trigger rate, the user may become quite frustrated by the need to constantly adjust the brightness control in an effort to produce a display with satisfactory intensity. What is desired is some way to continue to provide a useful display in the presence of a fluctuating trigger rate. And, while this problem has been discussed in the context of multi-bit raster scan displays with persistence, an ideal solution should also work for single bit rasterizations too.

BRIEF SUMMARY OF THE INVENTION

In accordance with the invention, one or more recently acquired waveform data sets are maintained in memory after they are initially rasterized. When the trigger and waveform acquisition rates become so low that rasterizer time is being wasted, one or more of the most recent previously acquired waveforms are automatically re-rasterized and displayed again to maintain the display until another newly acquired waveform becomes available. The rasterizer's readiness to re-rasterize a previously rasterized waveform data set can be qualified with a pre-determined or programmable time delay, thereby providing more flexibility for external circuitry and controllers to optimize utilization of the rasterizer's behavior.

DETAILED DESCRIPTION OF THE INVENTION

Figure 1:
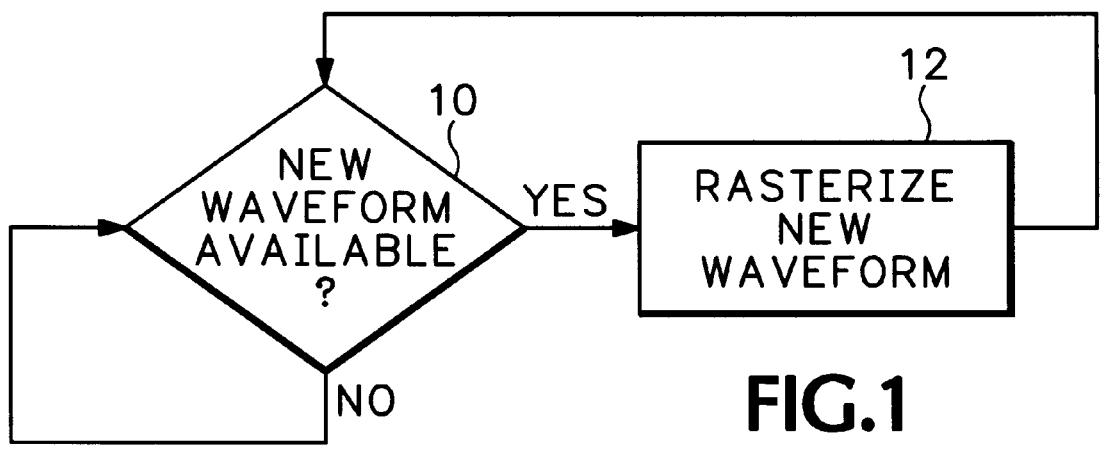
FIG. 1 is a logic diagram illustrating how rasterization was controlled according to the prior art.

Referring first to FIG. 1, rasterizer behavior according to the prior art simply waited for new waveforms to become available 10, and only continued rasterizing 12 after new waveform data became available.

Figure 2:
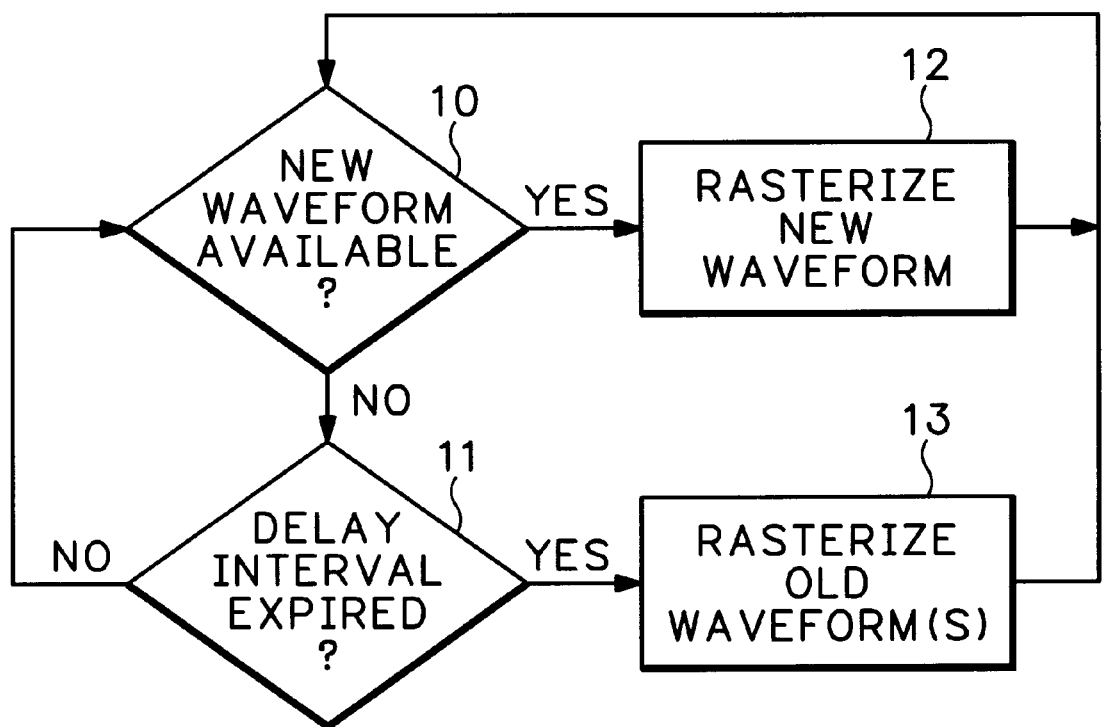
FIG. 2 is a logic diagram illustrating how rasterization is controlled according to the present invention.

Referring now to FIG. 2, according to the present invention, if a new waveform or the trigger associated with a new waveform is not available after a previous rasterization, decision block 10 produces a "no". This "no" starts the delay interval referred to in decision block 11. So long as the delay interval lasts, the "no" output of decision block 11 keeps sending the logical inquiry back to decision block 10, which is waiting for the arrival of the information that a new trigger signal has been received and a new waveform will soon be available. If no such information is received within the predetermined delay interval 11, decision block 11 produces a "yes" outcome and the rasterizer then performs a re-rasterization 13 of a previously rasterized waveform data set. Under some circumstances it might be necessary to re-rasterize the previously rasterized data sequence more than once before decision block 10 is satisfied by the availability of new waveform data. And, in an alternative implementation, more than one previously rasterized data sequence may be rerasterized by the operation of block 13.

In one embodiment, implemented in hardware, the delay interval of block 11 is provided by a counter/timer. The counter/timer is reset, or initialized to zero, continuously whenever the rasterizer referred to in blocks 12 and 13 is running, or when a trigger associated with the next waveform has been received, i.e., "yes" from decision block 10. In the absence of a current rasterization, and if no new trigger has been received, the reset or initialization signal is withdrawn and the counter/timer is allowed to count for the time of the delay interval, unless it is interrupted and reset by the availability of another trigger signal and the availability of a new waveform that such a trigger signal implies.

It should be noted that the "wait time" value can be set to zero, effectively eliminating decision block 11 from the method of the invention. With decision block 11 gone, or its wait time set to zero, rasterization of an old waveform begins immediately upon completion of the previous rasterization if no trigger signal indicates that new waveform data is available.

The ability to set the wait time is a general purpose control input that allows this re-rasterization technique to be optimized for a variety of operational environments. Since waveform data acquisition time can have various relationships with the time taken by the rasterization process, it may be desirable to lengthen, or shorten, or make equal to zero, the wait time before undertaking a re-rasterization. If new waveforms are being acquired very quickly compared with the time it is taking to rasterize them, the wait time should be set to be long enough to ensure that the rasterizer waits for the arrival of the next new waveform rather than starting with any re-rasterizations. However, if rasterization is occurring much more quickly than new waveforms are being acquired, a short or non-existent wait time will allow the rasterizer to do repeated cycles of re-rasterization while waiting for the availability of the next new waveform. Software in the instrument can obtain information about the internal trigger rate, trigger processing time, and the time being needed for rasterization, and from that information derive a desirable setting for the delay interval. How that time is used is beyond the scope of the present invention, but providing a capability for such a delay interval to be programmed and used is not.

It might also be desired under some circumstance to modify the behavior dictated by block 13 so that more than one old waveform sequence of data-address pairs is rasterized before returning to decision block 10 to determine if new waveform data is available.

It should also be noted that this technique works especially well with rasterizers that have some random element in the way they perform rasterization. For example, U.S. Pat. No. 5,412,579 to Meadows, et al. for "Slow Display Method for Digital Oscilloscope With Fast Acquisition System", hereby incorporated by reference, describes an oscilloscope system in which acquisitions are composited into alternating (also known as "ping-ponging") display buffers, so that while the contents of one display buffer is being used to display data to the user, the other one is being used to gather and composite more data.

The slow display of this design only provided a single bit of intensity data per pixel and therefore had no analog-like gray scaling capability. Nonetheless, the two single bit per pixel raster memories were used in a way that gave the operator some indication of the presence of intermittent signals. This was accomplished by using a randomizing process to qualify the compositing of the most recent waveform into the previously accumulated waveforms. With this approach, waveforms that were sufficiently intermittent only showed up as dotted lines, while waveforms that occurred most of the time would generally appear as completely filled in. Because of the single bit per pixel limitation of this implementation, extremely rare and not-so rare waveforms would tend to be misidentified, respectively, as not discernable or as always present.

Copending application by Sullivan et al. (assignee's docket number DF-6377) for "Sparse Vector Rasterization" shows the use of another form of randomization used by a rasterizer. It distributes pixel modification along a vector by using a combination of a random offset from zero and a calculated constant increment between successive locations, with the latter being indexed to the randomly determined offset.

In any event, as has been stated, rasterization schemes that include some form of randomization in their output are ideally suited for re-rasterization according to this invention. Rasterization processes that do not include any randomizing function at all will produce static displays when a single waveform is repeatedly re-rasterized. This might be a case where the re-rasterization of more that one waveform would lead to a more natural and active looking display.

While a preferred embodiment of the present invention has been shown and described, it will be apparent to those skilled in the art that many changes and modifications may be made without departing from the invention in its broader aspects. The claims that follow are therefore intended to cover all such changes and modifications as are permitted by the patents laws of the respective countries in which this patent is granted.

We claim:

1. A method for controlling rasterization activity to produce waveform displays in an electronic data acquisition instrument, the method comprising the steps of:

(a) repeatedly acquiring new sequences of data representative of electronic signal waveforms and storing the data sequences in a memory as sequences of data-address pairs;

(b) rasterizing a sequence of data-address pairs from the memory to produce a raster scan display image for storage in a raster memory;

(c) determining whether or not a new sequence of data-address pairs is ready for rasterization;

(d) if a new sequence of data-address pairs is ready for rasterization according to the determination of step (c), performing step (b) on the new sequence of data-address pairs; and (e) if a new sequence of data-address pairs is not ready for rasterization according to the determination of step (c), performing step (a) again on a previously rasterized sequence of data-address pairs.

2. A method for controlling rasterization activity according to claim 1 wherein step (c), the determining step, comprises the steps of:

(c.1) waiting for a delay interval to see if a new sequence of data-address pairs becomes ready for rasterization;

(c.2) ceasing to wait and proceeding to step (d) if a new sequence of data-address pairs is or becomes ready for rasterization; and (c.3) at the end of the delay interval, proceeding to step (e).

3. A method for controlling rasterization activity according to claim 2 wherein the delay interval is preset and constant.

4. A method for controlling rasterization activity according to claim 2 wherein the delay interval is variable.

5. A method for controlling rasterization activity according to claim 2 wherein the delay interval is variable and under control of other elements of the electronic data acquisition instrument during operation.

6. A method for controlling rasterization activity according to claim 2 wherein step (e) includes performing step (b) more than once.

7. A method for controlling rasterization activity according to claim 2 wherein step (e) includes performing step (b) on two or more previously rasterized sequences of data-address pairs.

8. A method for controlling rasterization activity according to claim 1 wherein step (e) includes performing step (b) more than once.

9. A method for controlling rasterization activity according to claim 1 wherein step (e) includes performing step (b) on two or more previously rasterized sequences of data-address pairs.

* * * * *

UNITED STATES PATENT AND TRADEMARK OFFICE
CERTIFICATE OF CORRECTION

| | | |
|---|---|---|
| PATENT NO. | : 5,995,117 | Page 1 of 1 |
| APPLICATION NO. | : 09/026186 | |
| DATED | : November 30, 1999 | |
| INVENTOR(S) | : Kenneth P. Dobyns, Robert A. Nishida and George S. Walker | |

It is certified that error appears in the above-identified patent and that said Letters Patent is hereby corrected as shown below:

Column 5, Lines 14-34, Claim 1:

1. A method for controlling rasterization activity to produce waveform displays in an electronic data acquisition instrument, the method comprising the steps of:
    (a) repeatedly acquiring new sequences of data representative of electrical signal waveforms and storing the data sequences in a memory as sequences of data-address pairs;
    (b) rasterizing a sequence of data-address pairs from the memory to produce a raster scan display image for storage in a raster memory;
    (c) determining whether or not a new sequence of data-address pairs is ready for rasterization;
    (d) if a new sequence of data address pairs is ready for rasterization according to the determination of step (c), performing step (b) on the new sequence of data-address pairs; and
    (e) if a new sequence of data-address pairs is not ready for rasterization according to the determination of step (c), performing step (b) again on a previously rasterized sequence of data-address pairs.

Signed and Sealed this

Seventeenth Day of July, 2007

JON W. DUDAS
*Director of the United States Patent and Trademark Office*